United States Patent [19]

Yuuki

[11] Patent Number: 5,479,052
[45] Date of Patent: Dec. 26, 1995

[54] CONTACT STRUCTURE WITH CAPACITOR FOR GROUP III-V SEMICONDUCTOR DEVICES

[75] Inventor: Kouichi Yuuki, Kawasaki, Japan

[73] Assignee: Fujitsu Limited, Kawasaki, Japan

[21] Appl. No.: 190,525

[22] Filed: Feb. 2, 1994

[30] Foreign Application Priority Data

Feb. 2, 1993 [JP] Japan .................................. 5-015147

[51] Int. Cl.$^6$ ........................... H01L 23/48; H01L 23/52; H01L 29/40; H01L 29/93

[52] U.S. Cl. ......................... 257/745; 257/743; 257/744; 257/766; 257/595

[58] Field of Search ..................................... 257/306, 308, 257/303, 312, 595, 596, 597, 598, 599, 600, 601, 602, 734, 744, 745, 758, 774, 766

Primary Examiner—Sara W. Crane
Assistant Examiner—Carl Whitehead, Jr.
Attorney, Agent, or Firm—Staas & Halsey

[57] ABSTRACT

A lower electrode, a first inorganic insulating film of SiN, and an organic insulating film of polyimide are formed on a GaAs substrate serving as an underlie, in this order. The organic insulating film is selectively etched to form a capacitor opening. A second norganic insulating film covering the surface of the organic insulating film and the bottom and side wall of the capacitor opening, and an upper electrode are formed. As the selective etching of the organic insulating film, wet etching may be used for simplifying manufacturing processes. Alternatively, dry etching may be used for improving etching accuracy. The organic insulating film 4 may be formed by a multi-layer film so that a circuit can be formed across multi-layers, improving the degree of integration.

9 Claims, 9 Drawing Sheets

(PRIOR WORK)

(PRIOR WORK)

(PRIOR WORK)

(PRIOR WORK)

(PRIOR WORK)

(PRIOR WORK)

CONTACT STRUCTURE WITH CAPACITOR FOR GROUP III-V SEMICONDUCTOR DEVICES

BACKGROUND OF THE INVENTION a) Field of the Invention

The present invention relates to a capacitor in a semiconductor integrated circuit which is used in communication fields or the like and, more particularly, to such a capacitor which has an organic insulating film as an interlayer insulating film, and to a method of manufacturing such a capacitor.

b) Description of the Related Art

Semiconductor devices used in highly sophisticated recent computers and communications are required to have high integration, reduced element size, high device performance, and cost effectiveness.

Recently, use of an organic insulating film as an interlayer insulating film has been examined intensively in order to improve surface flatness and reduce parasitic capacitance and the number of processes required for producing same.

Most semiconductor integrated circuits for communication fields use large capacitors and these capacitors are required to have a high yield relative to breakdown voltage and a high reliability.

SUMMARY OF THE INVENTION

It is an object of the present invention to provide a capacitor having a high yield relative to breakdown voltage and a high reliability.

According to one aspect of the present invention, there is provided a method of manufacturing a capacitor including the steps of forming a lower electrode on an underlie structure, such as a substrate, forming a first inorganic insulating film on the lower electrode, forming an organic insulating film on the first inorganic insulating film, selectively etching the organic insulating film to form a capacitor opening without etching the first inorganic insulating film, forming a second inorganic insulating film covering the surface of the organic insulating film and the bottom and side wall of the capacitor opening, and forming an upper electrode on the second inorganic insulating film.

Cracks are hard to be formed in the inorganic film at the bottom end portions of the capacitor opening. Even if cracks are formed, they do not go down to the inorganic insulating film above the lower electrode. Accordingly, capacitor breakdown deficiency can be avoided, and the manufacture yield and reliability of the semiconductor devices can be improved.

The first and second inorganic films are laminated between the capacitor electrodes, thus improving the breakdown voltage. A laminated layer of two dielectric films prevents pin holes in the two films at the same position.

The number of manufacturing processes can be reduced by etching the organic insulating film by the same wet etching liquid which was used for selective etching of a resist film.

If one or both of the first and second inorganic insulating films are formed by a multi-layer film, generation of through pin holes can be reduced further. If the organic insulating film is formed by a multi-layer film, a capacitor can be formed across a plurality of insulating layers. If the organic insulating film is formed by a multi-layer film interposing an inorganic film, a capacitor can be formed across a plurality of layers wherein the inorganic film can protect the surface of the organic film and improve the adhesive strength of the organic film to the electrodes.

DETAILED DESCRIPTION OF THE PREFERRED EMBODIMENTS

In order to help understand the present invention, a method of manufacturing a capacitor according to the prior work will be described first with reference to FIGS. 8A to 8F.

Figure 8A:
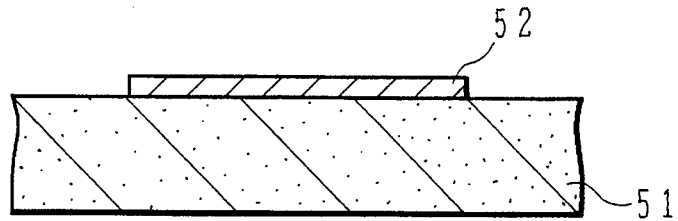
FIGS. 8A to 8F are cross sectional views of a capacitor in successive stages of fabrication, for explaining the processes of manufacturing a capacitor according to a prior work.

As shown in FIG. 8A, a semi-insulating GaAs substrate 51 is prepared for forming an integrated circuit thereon, the substrate has a resistivity of $1 * 10^7$ $\Omega$cm or higher. A lower electrode 52 of a capacitor is formed on the substrate 51.

The lower electrode 52 is made of an AuGeNi allow having a thickness of 4000 angstroms. AuGeNi is vapor-deposited on the semi-insulating GaAs substrate 51, alloyed at a temperature of 400° to 500° C., and patterned.

Figure 8B:
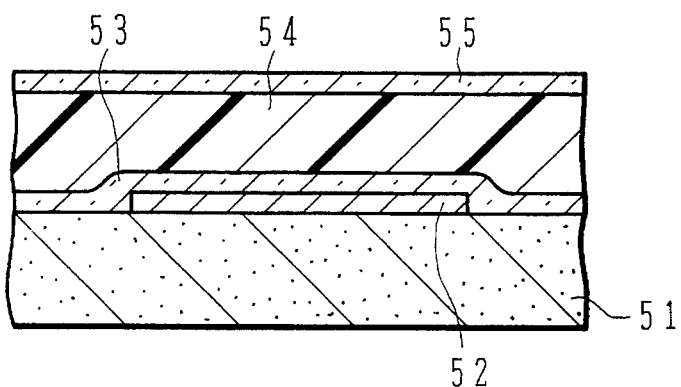

As shown in FIG. 8B, a SiN film 53 for enhancing an adhesive strength is deposited over the lower electrode 52 by plasma CVD to a thickness of 1000 angstroms. Polyimide is spin-coated on the SiN film 53, and cured at a temperature of 300° to 400° C. to form a polyimide film 54 having a thickness of 1 µm. If the polyimide film 54 is formed directly on the lower electrode 52 and GaAs substrate 51 without forming the SiN film 53, the adhesive strength of the polyimide film 54 is weak.

Next, an SiN film 55 is deposited by plasma CVD on the polyimide firm 54 to a thickness of 1000 angstroms.

Figure 8C:
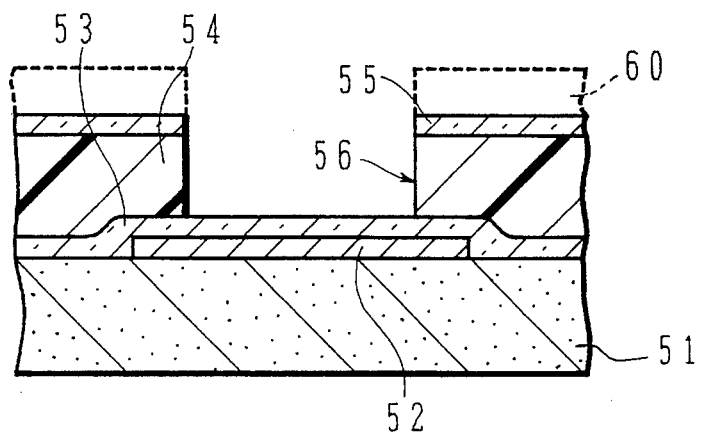

As shown in FIG. 8C, a resist film 60 is coated on the SiN film 55 and patterned to from an opening at the area corresponding to a capacitor opening 56.

Next, the SiN film 55 on the polyimide film 54 is selectively dry-etched by $SF_6$. By using the SiN film 55 with an opening therein as a mask, the polyimide film 54 is dry-etched by $O_2$ to form the capacitor opening 56 therein. At this time, the resist firm 60 is removed by $O_2$ etching.

Figure 8D:
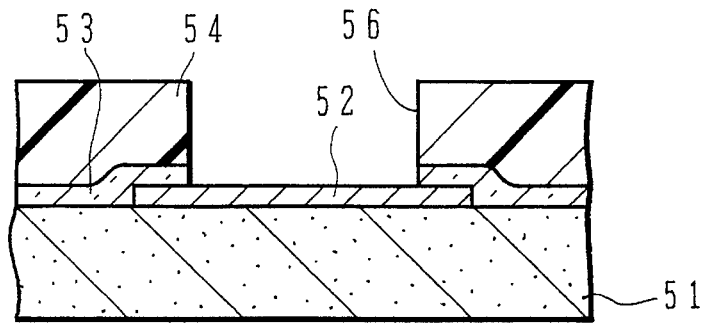

As shown in FIG 8D, the SiN film 53 on the bottom of the capacitor opening 56 and the SiN film 55 on the polyimide firm 54, used as the etching mask, are removed by dry etching with $SF_6$.

Figure 8E:
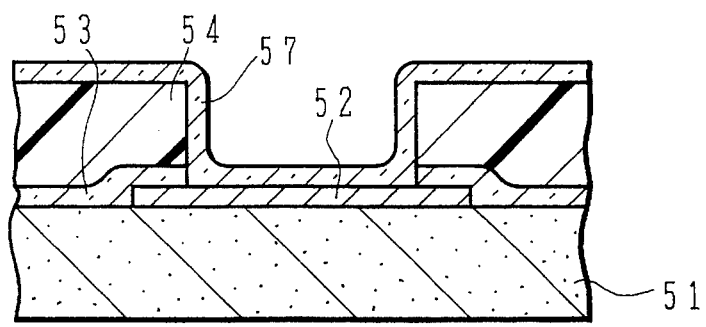

As shown in FIG. 8E, a SiN film 57 is formed by plasma CVD to a thickness of 2000 angstroms, this SiN film 57 being used a capacitor dielectric insulating film.

Figure 8F:
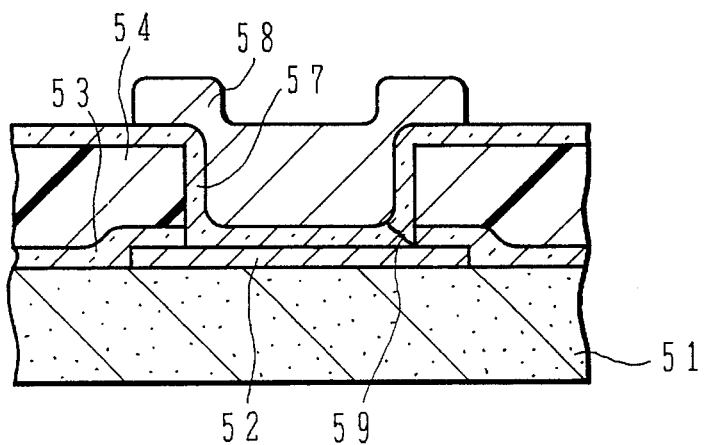

Lastly, as shown in FIG. 8F, an upper electrode 58 is formed on the SiN film 57.

This upper electrode 58 is formed by forming a Au/TiW or Au/Ti/Wsi laminated film through sputtering, by plating Au on the uppermost Au layer of the laminated film to obtain a thick Au film, and by patterning them.

However, a yield relative to breakdown voltage of a capacitor manufactured by the prior work is low.

The initial yield relative to breakdown voltage is as low as 70 to 80%, and the product deficiency factor increases with the use time.

It has been found that the main cause of breakdown voltage deficiency is cracks 59 formed in the SiN film 57 at the bottom end portion of the capacitor opening 56.

The embodiments of the present invention will be described which can suppress breakdown voltage failure.

Figure 1A:
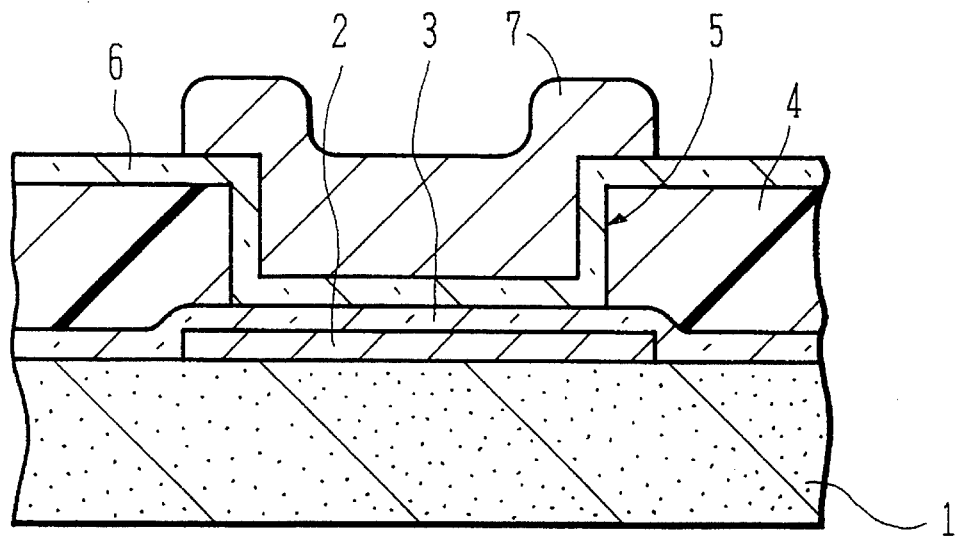
FIGS. 1A and 1B are cross sectional views of, a respective capacitor according to an embodiment of the present invention, and a circuit diagram in which a capacitor is used.

FIG. 1A is a cross sectional view of a capacitor according to an embodiment of the present invention.

A semi-insulating GaAs substrate 1 is prepared for forming an integrated circuit thereon. A lower electrode pattern 2 of a capacitor is formed on the substrate 1. A first inorganic insulating film 3 is formed thereon, and an organic insulating film 4 is formed on the first inorganic insulating film 3.

Next, by using a resist mask with an opening, the organic insulating film 4 is exposed in the opening is etched to form a capacitor opening 5, and the resist mask is removed. A second inorganic insulating film 6 is formed over the whole surface including the capacitor opening 5, and an upper electrode 7 is formed on the second inorganic insulating film 6. Capacitors having this structure exhibit a low breakdown voltage deficiency.

With this structure, the inorganic insulating film, used as the dielectric material of the capacitor, if formed by two films, i.e., the first and second inorganic insulating films 3 and 6. The second inorganic insulating film 6 contacts the first inorganic insulating film at the bottom of the opening 5. As a result, cracks are hard to be formed in the second inorganic insulting film 6 at the bottom end portion of the opening 5. Even if any crack is formed in the second inorganic insulating film 6, it does not go further down through the first inorganic insulating film. It is hypothesized therefore that breakdown voltage deficiency of capacitors is suppressed.

If one or both of the first and second inorganic insulating films 3 and 6 are formed by a multi-layer film, generation of through pin holes can be reduced further.

If wet etching is used for etching the organic insulating film 4, the same wet etching can be used for patterning the resist mask, simplifying manufacturing processes. If dry etching is used, the etching work precision can be improved.

If the organic insulating film 4 is formed by a multi-layer film, circuit elements and wirings may be interposed between layers of the multi-layered film, thus raising the integration degree. If at least one inorganic insulating film is inserted in the organic insulating film 4, circuit elements and wirings may be formed on the inorganic insulating film.

Figure 1B:
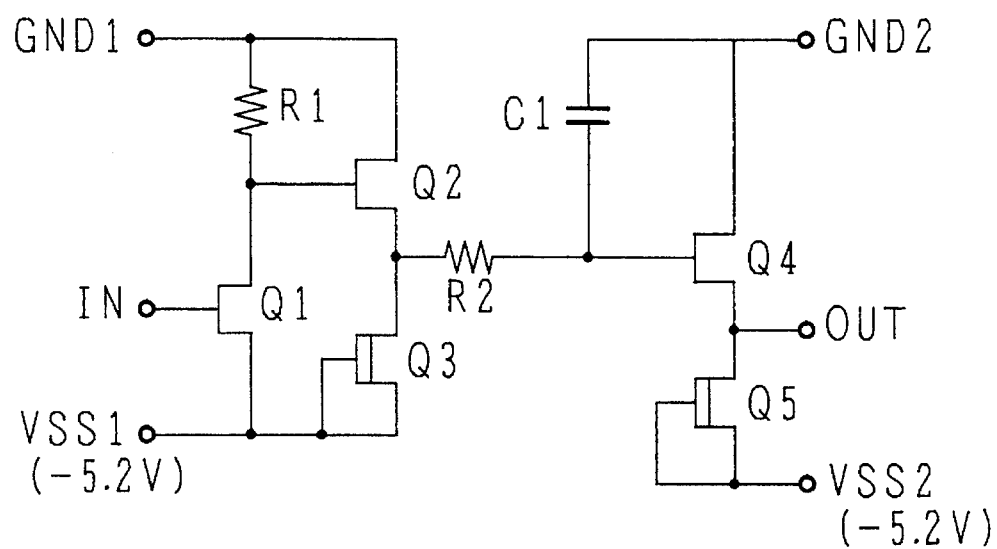

FIG. 1B shows an example of a circuit using a capacitor such as shown in FIG. 1A. This circuit is an average value detector for an optical LAN pre-amplifier. An input signal IN is applied to the gate electrode of an enhancement (E) type MESFET (metal semiconductor field effect transistor) Q1 serially connected to a resistor R1. A serial circuit of the resistor R1 and MESFET Q1 is connected between a ground potential GND1 and a power source voltage VSS1. The interconnection between the resistor R1 and MESFET Q1 is connected to the gate electrode of E-type MESFET Q2 which is serially connected to a depletion (D) type MESFET Q3. The E-type and D-type MESFETs Q2 and Q3 are connected between the ground potential GND1 and power source voltage VSS1, and the interconnection between MESFETs is connected to the gate electrode of an E-type MESFET Q4 via a resistor R2. MESFET Q4 is serially connected to a D-type MESFET Q5. E-type and D-type MESFETs Q4 and Q5 are connected between a ground potential GND2 and a power source voltage VSS2. A capacitor C1 such as shown in FIG. 1 is connected between the gate electrode of MESFET Q4 and the ground potential GND2. The resistor R2 and capacitor C1 constitute an integration circuit providing a function of detecting an average value. For example, R2 is 12 k$\Omega$, and C1 is 24 pF. An output signal is delivered from the interconnection between MESFETs Q4 and Q5.

The circuit shown in FIG. 1B can be integrated on a single semiconductor substrate on which other circuit elements may be formed integrally.

FIG. 2A to 2F are cross sectional diagrams explaining a method of manufacturing a capacitor according to an embodiment of the present invention, the method using wet etching.

Figure 2A:
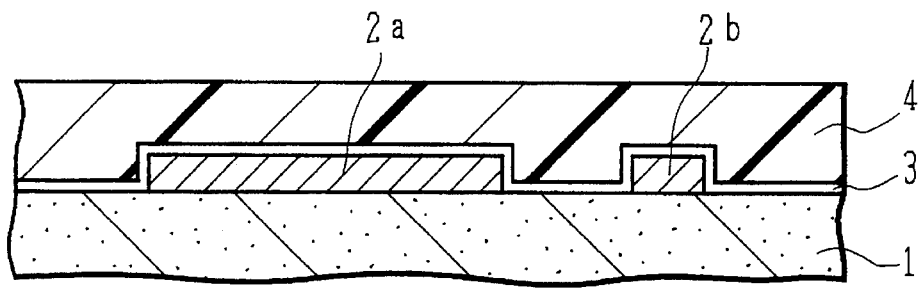
FIGS. 2A to 2F are cross sectional views explaining the process of manufacturing a capacitor according to an embodiment of the present invention.

As shown in FIG. 2A, a semi-insulating GaAs substrate 1 is prepared for forming an integrated circuit thereon, the substrate having a resistivity of $1*10^7$ $\Omega$cm or higher. A capacitor lower electrode 2a and a wiring electrode 2b are formed on the substrate 1 by the same metal layer.

The lower electrode layer 2 is made of an AuGeNi alloy having a thickness of 4000 angstroms. AuGeNi is vapor-deposited on the semi-insulating GaAs substrate 1, patterned, and alloyed at a temperature of 400° to 500° C.

Next, a first inorganic insulating film 3 made of SiN is deposited by plasma CVD over the electrodes 2a and 2b to a thickness of about 1000 angstroms. Thereafter, a polyimide layer is spin-coated thereon to form an organic insulating film 4 made of polyimide and having a thickness of about 1 μm.

Figure 2B:
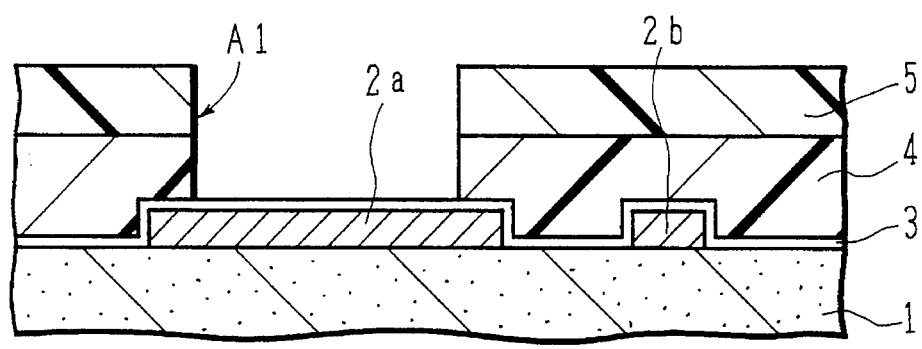

Next, as shown in FIG. 2B, a novolak based positive resist film 5 is coated on the organic insulating film 4. An opening for the capacitor is exposed on the resist film 5, and the resist film 5 is developed by developer to form an opening A1.

Next, by using the same developer, an opening for the capacitor is formed in the organic insulating film 4. At this time, the SiN film 3 is not etched. The development of the resist and the etching of the insulating film 4 may be done simultaneously or continuously.

Figure 2C:
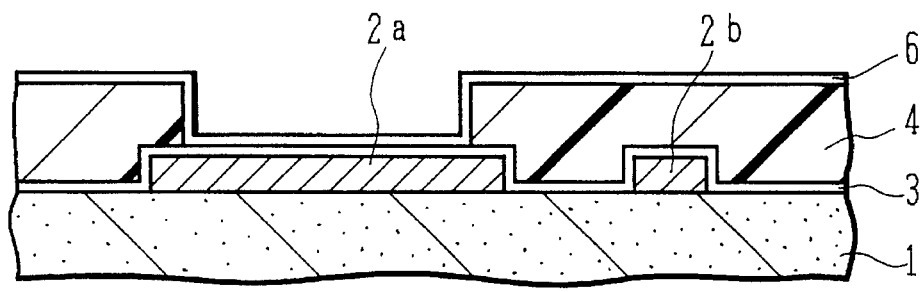

As shown in FIG. 2C, by using resist peel-off liquid (remover), the resist film 5 is removed, and the polyimide layer 4 is cured at a temperature of 300° to 400° C. A second inorganic insulating film 6 made of SiN is deposited by plasma CVD to a thickness of 2000 angstroms over the whole surface including the capacitor opening A1.

Figure 2D:
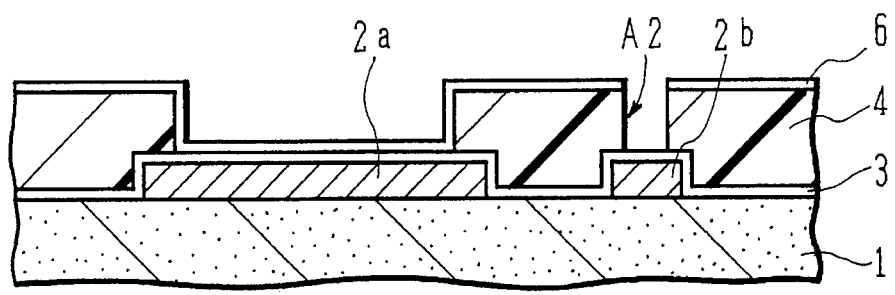

As shown in FIG. 2D, by using a resist mask having an opening at the area corresponding to the electrode 2b, the exposed SiN film 6 is dry-etched by using an SF$_6$ gas as an etchant. Next, the etchant is replaced by an etchant containing oxygen, and the polyimide layer 4 is dry-etched. The resist mask may be removed after etching the SiN film 6 because the resulting SiN pattern can be used as a mask for the dry-etching step.

Figure 2E:
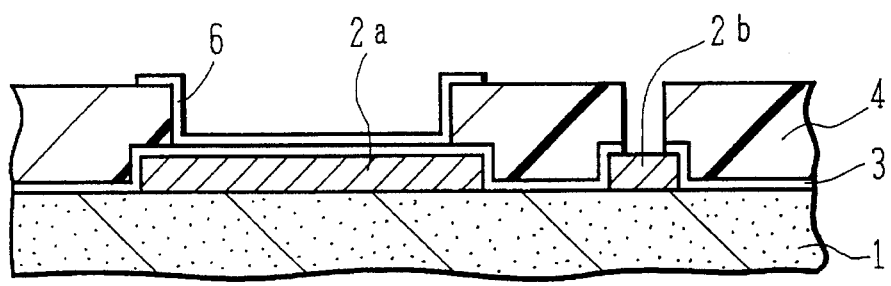

Next, as shown in FIG. 2E, by using a resist mask covering the opening for the capacitor, the exposed SiN film 3, 6 is dry-etched by using an SF$_6$ gas to expose the electrode 2b under the SiN film 3. Thereafter, the resist mask is removed.

Figure 2F:
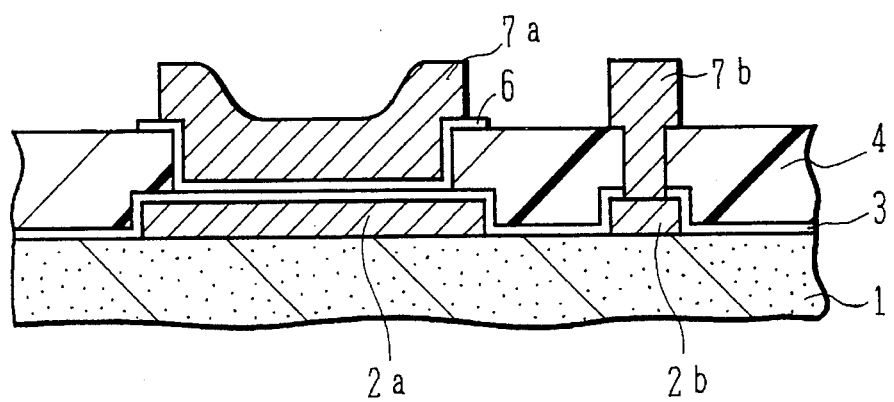

As shown in FIG. 2F, an upper electrode layer 7a, 7b is formed on the second inorganic insulating film 6 and polyimide layer 4 at the openings A1 and A2.

The upper electrode layer 7 is formed by forming a Au/TiW or Au/Ti/WSi laminated film through sputtering, by plating Au on the laminated film to obtain a thick Au film, and by patterning them.

In this embodiment, although wet etching is performed for etching the organic insulating film, dry etching may also be used.

FIGS. 3A to 3F are cross sectional views of a capacitor in successive stages of fabrication, for explaining the processes of manufacturing a capacitor according to another embodiment of the present invention, the method using dry etching.

Figure 3A:
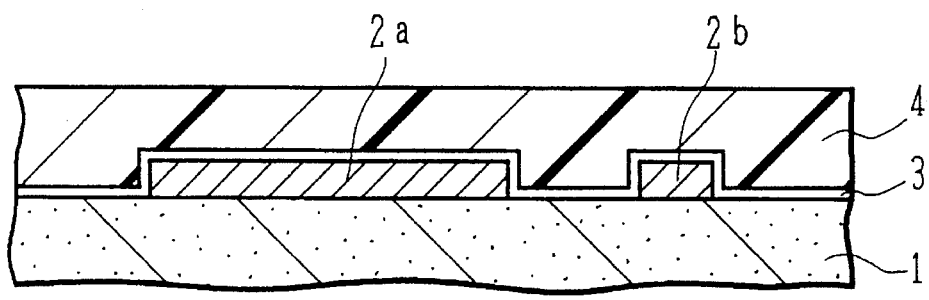
FIGS. 3A to 3F are cross sectional views of a capacitor in successive stages of fabrication, for explaining the processes of manufacturing a capacitor according to another embodiment of the present invention.

As shown in FIG. 3A, a metal layer is formed on a semiinsulating GaAs substrate 1, and patterned to form a capacitor lower electrode 2a and a wiring electrode 2b. An SiN film 3 is deposited over the electrodes 2a and 2b by CVD. The SiN film 3 has a thickness of, for example, 1000 angstroms. A polyimide layer 4 is coated covering the SiN film 3. The polyimide layer 4 has a thickness of, for example, about 1 μm, and is cured at a temperature of 300° to 400° C.

Figure 3B:
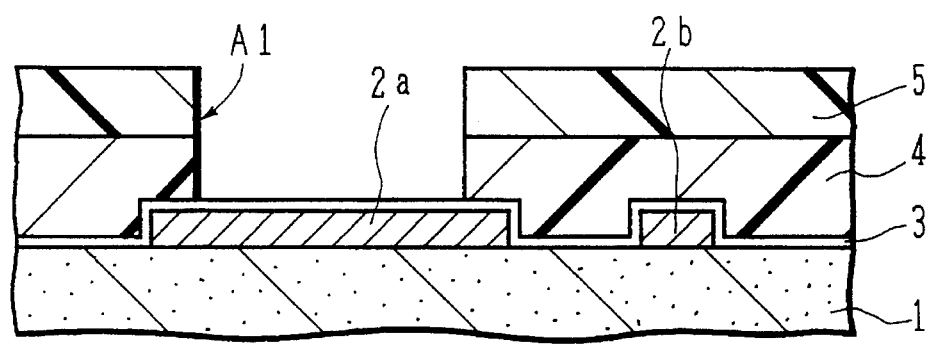

As shown in FIG. 3B, a novolak based resist film 5 is coated on the polyimide layer 4 to a thickness of about 5 μm. The resist film 5 is exposed and developed to form an opening A1 at the area corresponding to the capacitor lower electrode 2a.

Next, by using the resist layer 5 as etching mask, the polyimide layer 4 is dry-etched by using a gas containing oxygen as an etchant. In this manner, the SiN film 3 on the capacitor lower electrode 2a is exposed. After the dry etching, the resist layer 5 is removed.

Figure 3C:
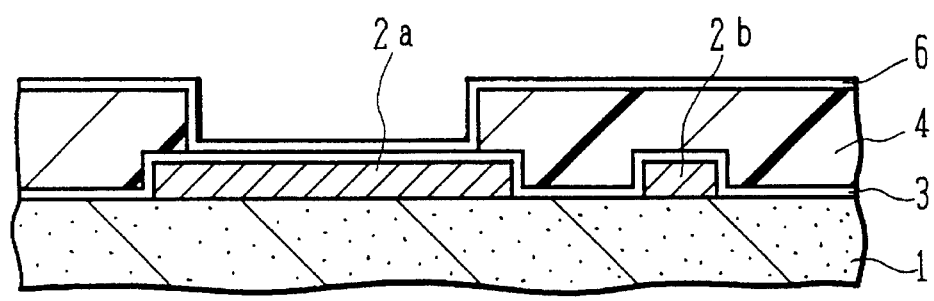
Figure 3D:
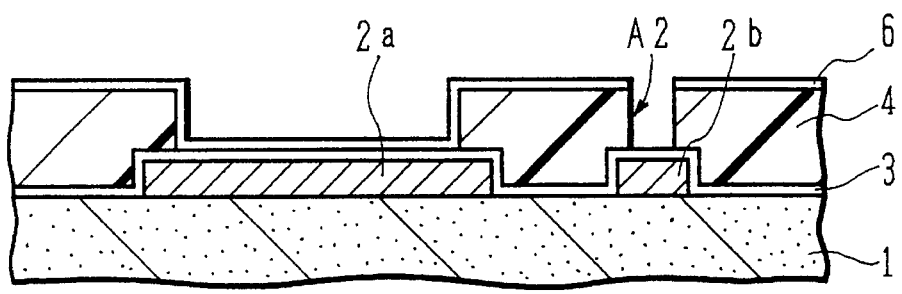

As shown in FIG. 3C, an SiN film 6 is formed by CVD over the whole surface of the device. The SiN layer 6 has a thickness of, for example, about 1000 angstroms.

Next, a novolak based positive resist film is again coated on the device surface, and a resist mask having an opening at the area corresponding to the wiring electrode 2b is formed. By using this resist mask as etching mask, the SiN film 6 is dry-etched by using an SF$_6$ gas as an etchant. The resist mask is then removed, and by using the SiN layer 3 as mask, the polyimide layer is dry-etched by using a gas containing oxygen as an etchant. In this manner, the SiN film 3 on the wiring lower electrode 2b is exposed.

Figure 3E:
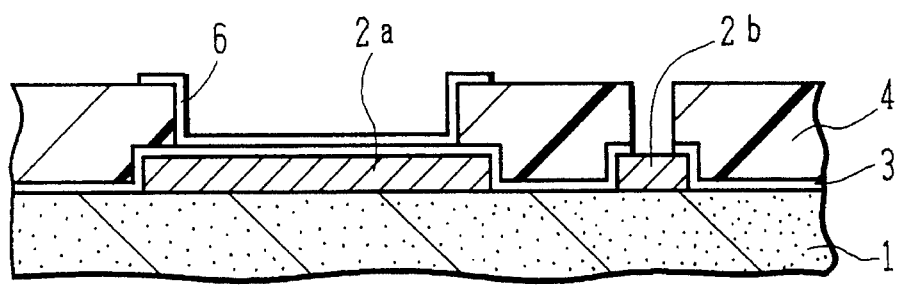

Next, as shown in FIG. 3E, by using a resist mask covering the opening for the capacitor, the exposed SiN film 6 and the SiN film 3 in the opening A2 are dry-etched by using an SF$_6$ gas as an etchant to expose the wiring lower electrode 2b. Thereafter, the resist layer is removed.

Figure 3F:
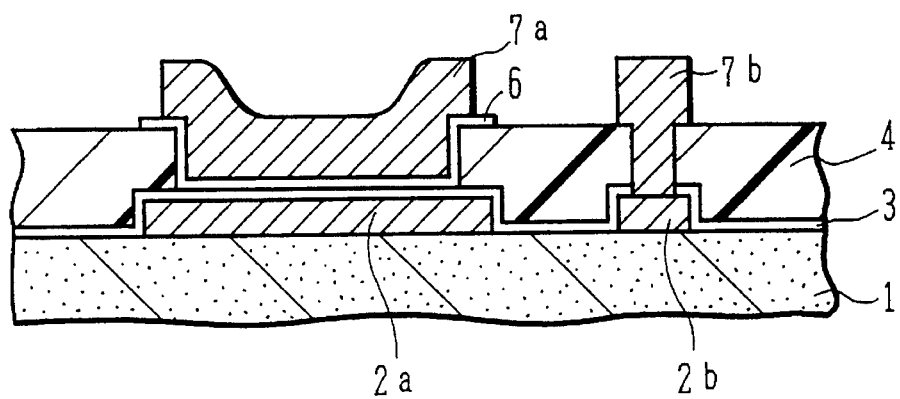

As shown in FIG. 3F, an upper electrode layer is deposited and patterned to form upper electrodes 7a, 7b. The electrode 7a is the upper electrode of the capacitor, and the electrode 7b is a wiring connected to the electrode 2b.

In this embodiment, the capacitor dielectric insulating film is formed by the SiN films 3 and 6. The lower SiN film 3 serves to tightly adhere the polyimide layer so that its thickness is preferably set to 500 to 2000 angstroms. The upper SiN film 6 is also used as the mask for patterning a contact hole for the electrode 2b so that its thickness is preferably set to 500 to 2000 angstroms. These SiN films are likely to have cracks at curved portions. As shown in FIG. 3A, the lower SiN film 3 has steps at the side walls of the lower electrodes 2. Even if cracks are generated at the steps, there is no practical problem regarding the insulation of the capacitor because the steps are covered with the polyimide layer 4.

The upper SiN film 6 has curved portions at upper and lower ends of the side walls of the opening A1. Since the lower ends are positioned on the flat area of the lower SiN film 3, even if cracks are generated in the upper SiN film 6 at the opening lower ends, they seldom go down through the lower SiN film 3. Even if cracks are generated at the opening upper ends, the insulation of the capacitor is rarely deteriorated because the polyimide layer 4 is formed at the opening upper ends.

In this embodiment, a laminated layer of two SiN films is used as the capacitor dielectric insulating film. Dielectric insulating films having different materials may be laminated. A laminated layer of three or more films may also be used unless the total thickness is set unnecessarily large.

Figure 4:
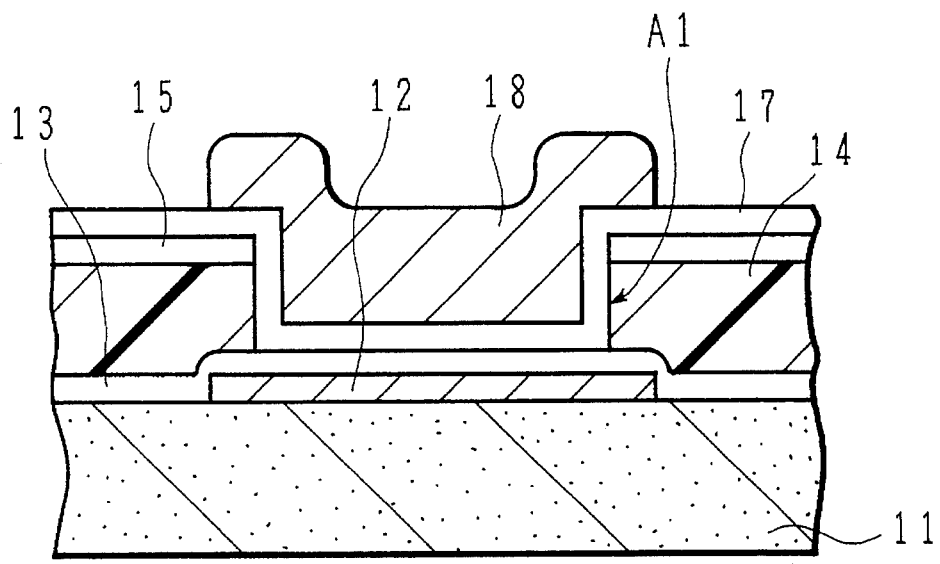
FIGS 4 to 7 are cross sectional views of capacitors according to other embodiments.

FIG. 4 is a cross sectional view of a capacitor according to another embodiment of the present invention. Referring to FIG. 4, a lower electrode 12 essentially consisting of AuGeNi is patterned on a GaAs substrate 11. A first inorganic insulating film 13, essentially consisting of SiN, is formed on the whole surface of the device including the lower electrode 12. An organic insulating film 14 essentially consisting of silicon resin and an inorganic insulating film 15 essentially consisting of SiO$_2$ are formed on the organic insulating film 14 in this order. A capacitor opening A1 is formed in the inorganic insulating film 15 and organic insulating film 14. A third inorganic insulating film 17 essentially consisting of SiN is formed on the whole surface of the device including the capacitor opening A1. An upper electrode 18 essentially consisting of WSi/Ti/Au is formed on the third inorganic insulating film 17, the upper electrode being filled in the capacitor opening A1.

A laminated layer of the second inorganic insulating film 15 essentially consisting of SiO$_2$ and the third inorganic insulating film 17 essentially consisting of SiN prevents pin holes from being formed through both the insulating films 15 and 17.

Generation of pin holes in the first inorganic insulating film 13 is avoided further, if the first inorganic film 13 is formed by a plurality of layers, under the effects of the laminated layer of the second and third inorganic insulating films 15 and 17. The second and third inorganic films each may be formed by a plurality of layers.

Figure 5:
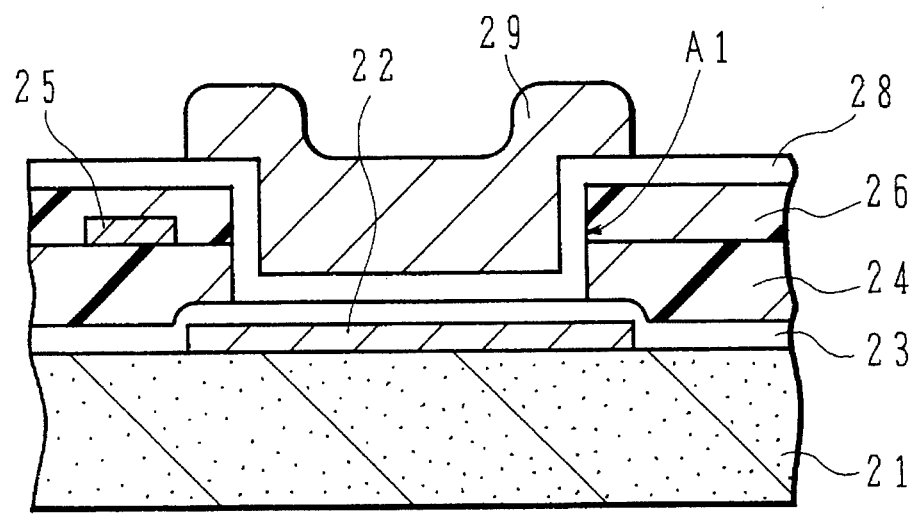

FIG. 5 is a cross sectional view of a capacitor according to another embodiment of the present invention.

Referring to FIG. 5, a lower electrode 22 essentially consisting of AuGeNi is formed on a GaAs substrate 21. A first inorganic insulating film 23 essentially consisting of SiN is formed on the whole surface of the device including the lower electrode 22. An organic insulating film 24 essentially consisting of polyimide is formed on the first inorganic insulating film 23. A wiring 25 essentially consisting of Au/TWi or Au/Ti/WSi is formed on the first inorganic insulating film 24, and a second inorganic insulating film 26 essentially consisting of polyimide is formed on the whole surface of the device. A capacitor opening A1 is formed in the second organic insulating film 26 and first organic insulating film 23. A second inorganic insulating film 28 essentially consisting of SiN is formed on the whole surface of the device including the capacitor opening A1. An upper electrode 29 essentially consisting of Au/TiW or Au/Ti/WSi is formed on the second inorganic insulating film 28, the upper electrode being filled in the capacitor opening A1.

Cracks are hard to be formed because the first and second inorganic insulating films 23 and 28 essentially consisting of SiN are formed on the bottom of the capacitor opening A1. Even if cracks are formed in the second inorganic insulating films 28, they do not go down to the first inorganic insulating film 23 above the lower electrode. Accordingly, capacitor breakdown deficiency can be avoided, and the manufacture yield and reliability of semiconductor devices can be improved.

Since the wiring 25 is formed between the first and second organic insulating films 24 and 26, a complicated circuit structure becomes possible, improving the degree of integration.

Figure 6:
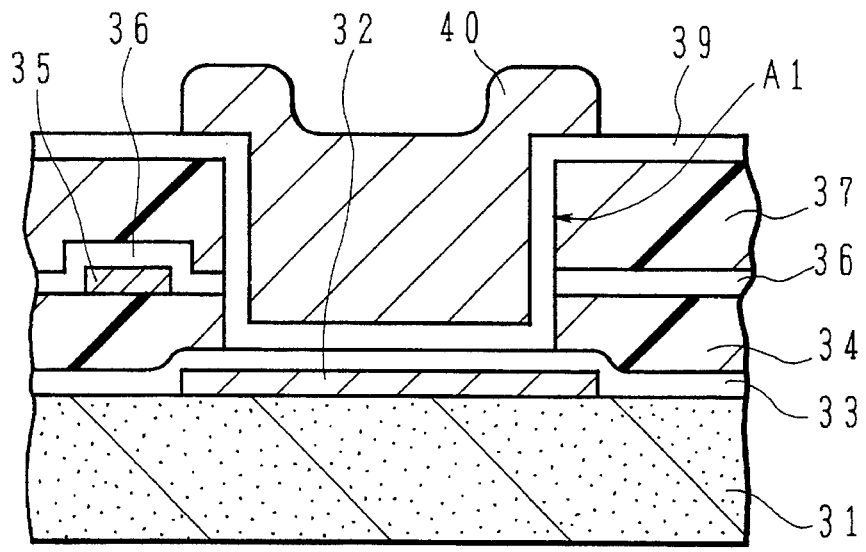

FIG. 6 is a cross sectional view of a capacitor according to another embodiment of the present invention.

Referring to FIG. 6, a lower electrode 32 essentially consisting of AuGeNi is formed on a GaAs substrate 31. A first inorganic insulating film 33 essentially consisting of SiN is formed on the whole surface of the device including the lower electrode 32. A first organic insulating film 34 essentially consisting of polyimide is formed on the first inorganic insulating film 33. A wiring 35 essentially consisting of Au/TiW or Au/Ti/WSi is formed on the first organic insulating film 34. A second inorganic insulating film 36 essentially consisting of SiN is formed on the whole surface of the device including the wiring 35. A second organic insulating film 37 essentially consisting of polyimide is formed on the second inorganic insulating film 36. A capacitor opening A1 is formed in the second organic insulating film 37, second inorganic insulating film 36, and first organic insulating film 34. A third inorganic insulating film 39 essentially consisting of SiN is formed on the whole surface of the device including the capacitor opening A1. An upper electrode 40 essentially consisting of Au/TiW or Au/Ti/WSi is formed on the third inorganic insulating film 39, the upper electrode being filled in the capacitor opening A1.

Cracks are hard to be formed because the first and second inorganic insulating films 33 and 39 are formed on the bottom of the capacitor opening A1. Even if cracks are formed in the second inorganic insulating films 39, they do not go down through the first inorganic insulating film 33 above the lower electrode. Accordingly, capacitor breakdown deficiency can be avoided, and the manufacture yield and reliability of semiconductor devices can be improved.

Since the wiring 35 is formed between the first and second organic insulating films 34 and 37, the degree of integration can be improved. The adhesive strength between the first and second organic insulating films 34 and 37 can be improved by the second inorganic insulating film 36.

Figure 7:
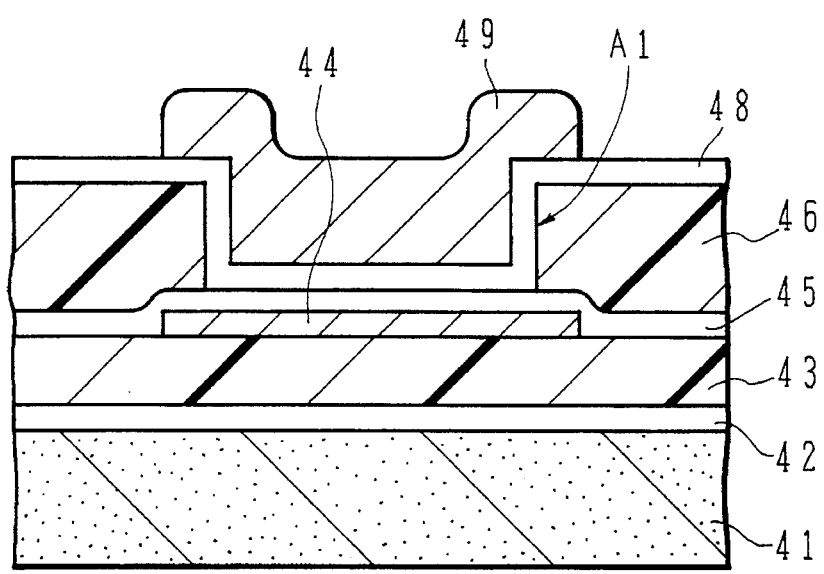

FIG. 7 is a cross sectional view of a capacitor according to another embodiment of the present invention.

Referring to FIG. 7, a circuit layer 42 constituted by wirings essentially consisting of WSi or AuGeNi, transistors, resistors, and the like is formed on a GaAs substrate 41. An interlayer insulating film 43 essentially consisting of polyimide is formed on the circuit layer 42. A lower electrode 44 essentially consisting of Au/TiW or Au/Ti/WSi is formed on the interlayer insulating film 43. A first inorganic insulating film 45 essentially consisting of SiN is formed on the whole surface of the device including the lower electrode 44. An organic insulating film 46 essentially consisting of polyimide is formed on the first inorganic insulating film 45. A capacitor opening A1 is formed in the organic insulating film A1. A second inorganic insulating film 48 essentially consisting of SiN is formed on the whole surface of the device including the capacitor opening A1. An upper electrode 49 essentially consisting of Au/TiW or Au/Ti/WSi is formed on the inorganic insulating film 48.

Cracks are hard to be formed because the first and second inorganic insulating films 45 and 48 are formed on the bottom of the capacitor opening A1. Even if cracks are formed in the second inorganic insulating films 48, they do not go down through the first inorganic insulating film 45 above the lower electrode 44. Accordingly, capacitor breakdown deficiency can be avoided, and the manufacture yield and reliability of semiconductor devices can be improved.

Since the lower electrode 44 is formed on the interlayer insulating film 43, a circuit can be formed under the lower electrode 44, and the degree of integration can be improved.

The present invention has been described in connection with the preferred embodiments. The invention is not limited only to the above embodiments. It is apparent for those skilled in the art that various modifications, substitutions, combinations and the like can be made without departing from the scope of the appended claims.

I claim:

1. A group III-V compound semiconductor device comprising:
    a group III-V compound semiconductor substrate;
    a lower electrode formed on said substrate;
    a first dielectric insulating film covering said lower electrode;
    an interlayer insulating film comprising, at least partially, an organic insulating material and formed on said first dielectric insulating film, said interlayer insulating film having an opening therein disposed above said lower electrode, a surface portion of said first dielectric insulating film being exposed through said opening;
    a second dielectric insulating film formed on said interlayer insulating film and laminated on the surface portion of said first dielectric insulating film exposed through said opening; and
    an upper electrode formed on said second dielectric insulating film in said opening.

2. A III-V compound semiconductor device according to claim 1, wherein said lower electrode consists essentially of AuGeNi.

3. A III-V group compound semiconductor device according to claim 1, wherein each of said first and second dielectric insulating films consists essentially of SiN.

4. A III-V group compound semiconductor device according to claim 1, wherein a total thickness of said first and second dielectric insulating films is in the range of from 500 to 5000 angstroms.

5. A III-V group compound semiconductor device according to claim 1, wherein each of said first and second dielectric insulating films has a thickness in a range of from 500 to 2000 angstroms.

6. A group III-V compound semiconductor device comprising:
    a group III-V compound semiconductor substrate;
    a lower electrode formed on said substrate;
    a first dielectric insulating film covering said lower electrode and the substrate;
    an interlayer insulating film comprising, at least partially, an organic insulating material and formed on said first dielectric insulating film, said interlayer insulating film having an opening therein disposed above a region of said lower electrode, a surface portion of said first dielectric insulating film being exposed through the opening;
    a second dielectric insulating film formed on said interlayer insulating film and stacked on said surface portion of said first dielectric insulating film exposed through said opening; and
    an upper electrode formed on said second dielectric insulating film in said opening.

7. A III-V compound semiconductor device according to claim 6, wherein said substrate has a flat surface and said lower electrode consists essentially of AuGeNi and protrudes above said flat surface of said substrate.

8. A III-V group compound semiconductor device according to claim 7, wherein said interlayer insulating film is a polyimide film and said first and second dielectric insulating films jointly form a capacitor dielectric film and have a total thickness in a range of from 500 to 5000 angstroms.

9. A III-V group compound semiconductor device according to claim 8, wherein each of said first and second dielectric insulating films is formed of SiN and has a thickness in a range of from 500 to 2000 angstroms.

* * * * *

UNITED STATES PATENT AND TRADEMARK OFFICE
CERTIFICATE OF CORRECTION

PATENT NO. : 5,479,052
DATED : Dec. 26, 1995
INVENTOR(S) : YUUKI

It is certified that error appears in the above-indentified patent and that said Letters Patent is hereby corrected as shown below:

TITLE PAGE:

item [57] ABSTRACT, line 5, change "norganic" to --inorganic--.

Col. 2, line 8, change "a respective" to --respectively, a--;
line 12, change "process" to --processes--;
line 35, change "allow" to --alloy--.

Signed and Sealed this

Fourth Day of June, 1996

*Attest:*

BRUCE LEHMAN

*Attesting Officer*      Commissioner of Patents and Trademarks